United States Patent
Tinnemans

(10) Patent No.: US 7,508,491 B2
(45) Date of Patent: Mar. 24, 2009

(54) LITHOGRAPHIC APPARATUS AND DEVICE MANUFACTURING METHOD UTILIZED TO REDUCE QUANTIZATION INFLUENCE OF DATAPATH SLM INTERFACE TO DOSE UNIFORMITY

(75) Inventor: Patricius Jacobus Aloysius Tinnemans, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 454 days.

(21) Appl. No.: 11/402,274

(22) Filed: Apr. 12, 2006

(65) Prior Publication Data
US 2007/0242252 A1 Oct. 18, 2007

(51) Int. Cl.
G03B 27/54 (2006.01)
G03B 27/42 (2006.01)

(52) U.S. Cl. .................................. 355/67; 355/53

(58) Field of Classification Search .................. 355/53, 355/67; 438/16; 430/322; 359/239, 855; 382/141; 716/19
See application file for complete search history.

(56) References Cited

U.S. PATENT DOCUMENTS

| | | | |
|---|---|---|---|
| 5,229,872 | A | 7/1993 | Mumola |
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,982,553 | A | 11/1999 | Bloom et al. |
| 6,133,986 | A | 10/2000 | Johnson |
| 6,177,980 | B1 | 1/2001 | Johnson |
| 6,687,041 | B1 | 2/2004 | Sandstrom |
| 6,747,783 | B1 | 6/2004 | Sandstrom |
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 2004/0041104 | A1 | 3/2004 | Liebregts et al. |
| 2004/0130561 | A1 | 7/2004 | Jain |
| 2004/0145712 | A1* | 7/2004 | Bleeker ................... 355/53 |
| 2005/0007572 | A1 | 1/2005 | George et al. |
| 2007/0009146 | A1* | 1/2007 | Hendricus Hoeks et al. 382/141 |

FOREIGN PATENT DOCUMENTS

| | | |
|---|---|---|
| WO | WO 98/33096 | 7/1998 |
| WO | WO 98/38597 | 9/1998 |

* cited by examiner

*Primary Examiner*—Peter B Kim
(74) *Attorney, Agent, or Firm*—Sterne, Kessler, Goldstein & Fox P.L.L.C

(57) ABSTRACT

A lithography method and system comprise an array of individually controllable elements, a first datapath section, a second datapath section, and a quantization device. The array of individually controllable elements modulates a beam of radiation. The first datapath section converts data defining a requested dose pattern into a stream of setpoint data defining a desired sequence of setpoints for the array of individually controllable elements. The second datapath section stores and reproduces the stream of setpoint data for the array of individually controllable elements. The quantization device digitizes the stream of setpoint data before it is passed from the first datapath section to the second datapath section. The first datapath section further comprises a noise controller configured to incorporate noise of a predetermined magnitude into the stream of setpoint data before it is digitized by the quantization device.

10 Claims, 5 Drawing Sheets

LITHOGRAPHIC APPARATUS AND DEVICE MANUFACTURING METHOD UTILIZED TO REDUCE QUANTIZATION INFLUENCE OF DATAPATH SLM INTERFACE TO DOSE UNIFORMITY

BACKGROUND

1. Field of the Invention

The present invention relates to a lithographic apparatus, an array of individually controllable elements and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Where an array of individually controllable elements is used as a patterning device, some form of conversion tool or "datapath" is needed to translate a requested dose pattern to a control signal suitable for actuating elements of the array at appropriate times. For example, where the array of individually controllable elements comprises a mirror array, the voltages (defining "setpoints") will be chosen so as to cause individual mirrors or groups of mirrors to tilt in such a way as to deflect an appropriate portion of incident radiation through the projection system.

Where a desired dose pattern comprises uniform regions or edges, rounding errors arising from quantization of a data stream defining setpoints for the elements of the array of individually controllable elements can lead to a reduction in dose uniformity and/or critical dimension uniformity (the "critical dimension" or "CD" referring to the size of the smallest printable feature).

Therefore, what is needed is a system and method for providing a datapath architecture that reduces the impact of quantization noise arising from digitization of a data stream representing the desired dose pattern.

SUMMARY

In one embodiment of the present invention, there is provided a lithography apparatus comprising an array of individually controllable elements, a first datapath section, a second datapath section, and a quantization device. The array of individually controllable elements modulates a beam of radiation. The first datapath section converts data defining a requested dose pattern into a stream of setpoint data defining a desired sequence of setpoints for the array of individually controllable elements. The second datapath section stores and reproduces the stream of setpoint data for the array of individually controllable elements. The quantization device digitizes the stream of setpoint data before it is passed from the first datapath section to the second datapath section. The first datapath section further comprises a noise controller configured to incorporate noise of a predetermined magnitude into the stream of setpoint data before it is digitized by the quantization device.

According to another embodiment of the present invention, there is provided a device manufacturing method, comprising: using an array of individually controllable elements to modulate a beam of radiation, projecting the beam onto a substrate, using a first datapath section to convert data defining a requested dose pattern to a stream of setpoint data defining a desired sequence of setpoints of the array of individually controllable elements, using a second datapath section to store and reproduce the stream of setpoint data for the array of individually controllable elements, digitizing the setpoint data stream prior to passing it from the first datapath section to the second datapath section, and using a noise controller to incorporate noise into the setpoint data stream before it is digitized.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
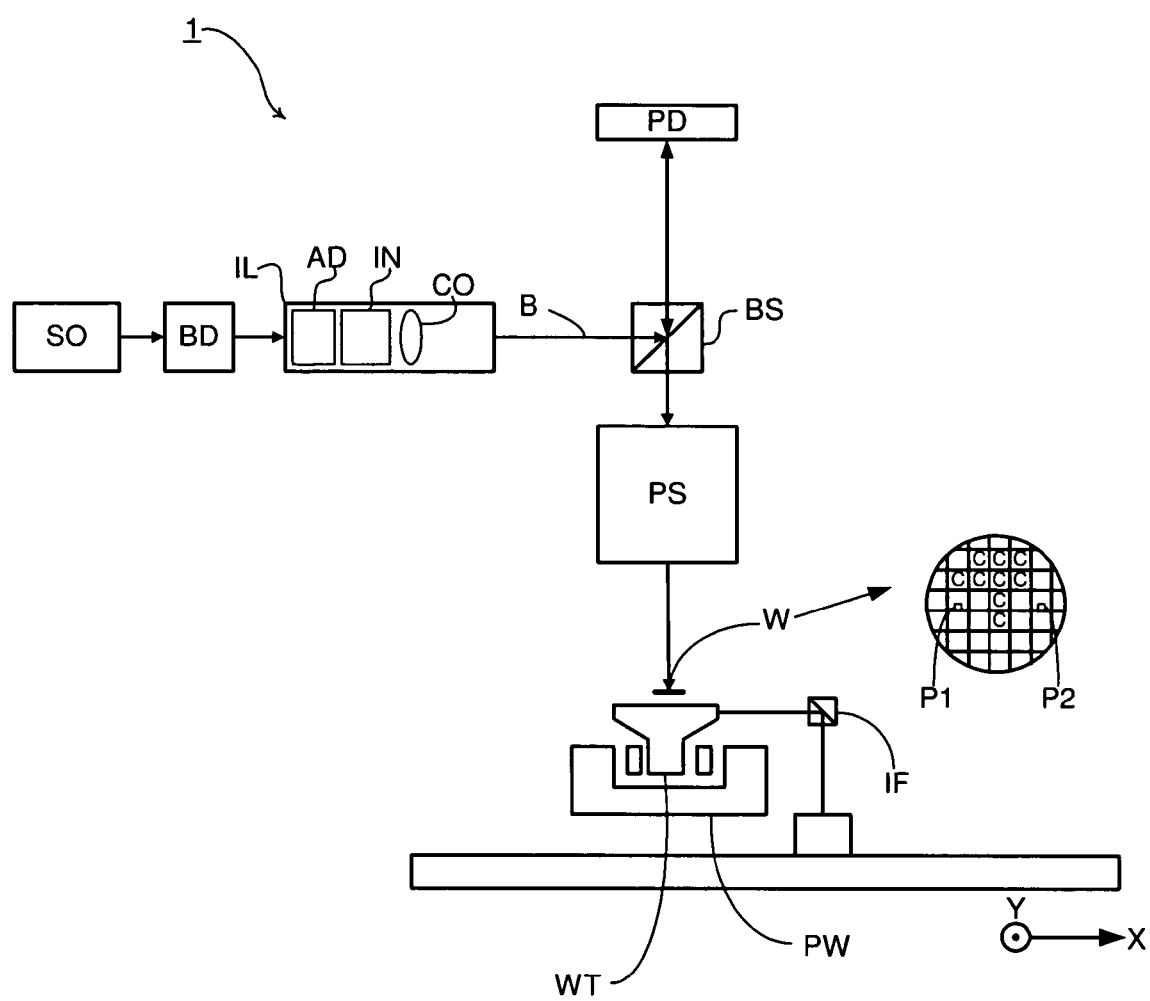
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g.; UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend, e.g., on the substrate material and/or the substrate dimensions. In one example, the thickness is at least 50 μm, e.g., at least 100 μm, at least 200 μm, at least 300 μm, at least 400 μm, at least 500 μm, or at least 600 μm. The thickness of the substrate can be at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
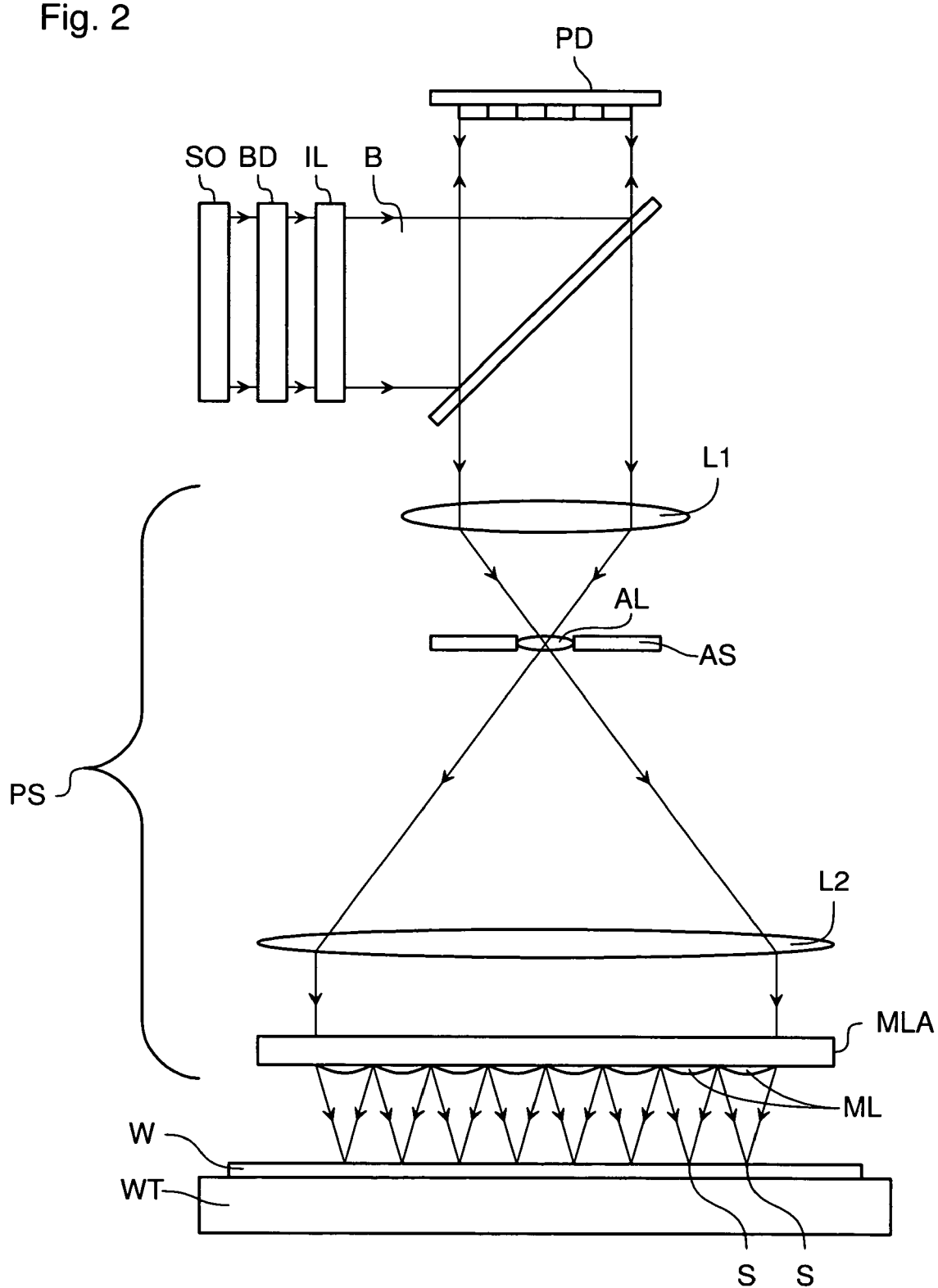

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
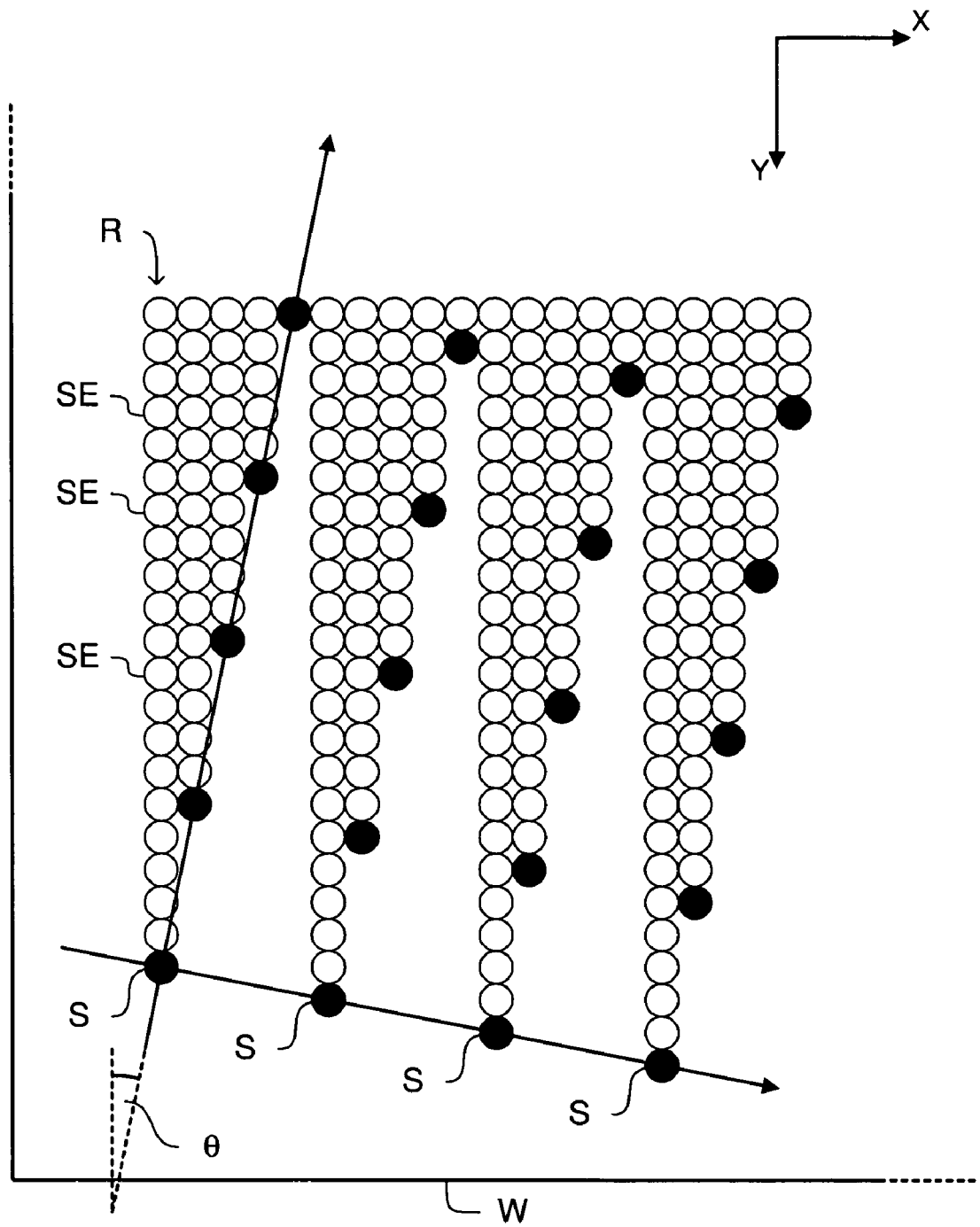
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
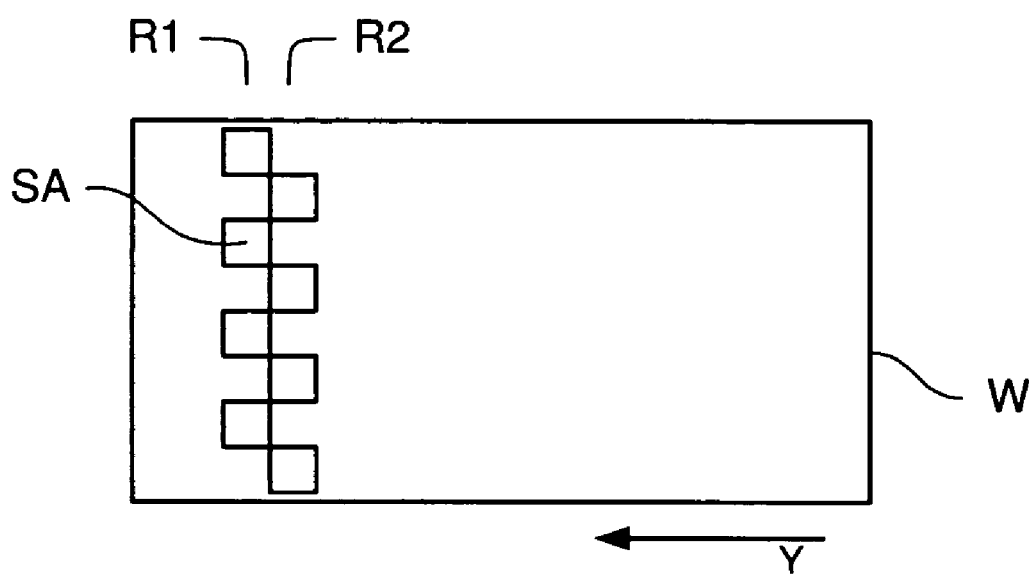
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
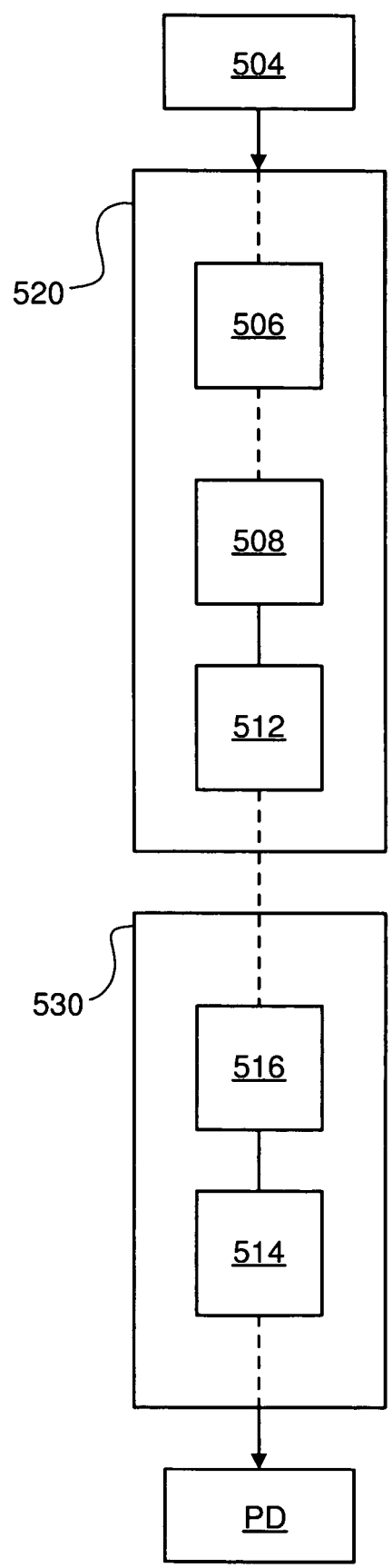
FIG. 5 depicts a datapath architecture with a noise controller, according to one embodiment of the present invention.

FIG. 5 depicts datapath sections 520 and 530, according to one embodiment of the present invention. Datapath sections 520 and 530 notionally incorporate all data processing and transmission components that together allow the requested dose-map (as defined by a user via an input device 504) to be transferred to the patterning device PD in an appropriate form. The datapath sections 520 and 530 comprise one or more data manipulation devices, each of which is configured to analyze an incoming data stream comprising a (usually partly processed) version of the requested dose-map and output the signal to the patterning device PD or to devices that will process the data stream further before passing it on to the patterning device PD.

In one example, datapath section 520 can comprise all processing elements that operate offline (i.e., not in real time or simultaneous with exposure of the substrate W to patterning radiation). In this example, datapath section 530 can comprise all those elements of the datapath that operate substantially in real time or "online" (i.e., substantially during exposure of the substrate W to patterning radiation).

As shown in FIG. 5, a rastorizer device 506 can also be provided. Rastorizer device 506 can be used to convert the descriptive representation of the desired pattern input by a user via device 504 into a sequence of data (e.g., a "data stream") that substantially corresponds with a sequence of exposure of the substrate W. The conversion can be done to enable pattern data to be transferred to the patterning device and/or online processing elements as it is needed. Data representing the rastorized requested dose pattern can define a sequence of setpoints for elements of the patterning device PD, for example. The data can be forwarded progressively over a period of time by the rastorizer 506 for direct use by online elements of the datapath. Alternatively, the data can be stored temporarily to be accessed when necessary by online elements of the datapath. Broken line portions in the datapath illustrated in FIG. 5 represent potentially indirect connections, which can be made via one or more intervening elements or data manipulation devices.

In one example, a quantization device 512 can be provided to facilitate transfer and possible storage of the rastorized data or a portion of the rastorized data. The quantization device 512 can be used to convert the analog setpoint data stream input to the quantization device 512 to a digital data stream. Based on the example discussed above, the digital data stream is then communicated from the offline datapath section 520 to the online datapath section 530. The digital data stream can be stored and eventually processed in order to produce a control signal for controlling the array of individually controllable elements PD to form a desired dose pattern on the substrate W.

Additionally, or alternatively, a digital to analog converter 516 (DAC) can be provided as part of the conversion of the data stream to a control signal. DAC 516 can be used to convert the digital data stream back to an analog data stream suitable for forming a control signal for the array of individual controllable elements PD.

The final radiation dose at a given point on the substrate W depends on the dose arising from a number of different elements of the array of individually controllable elements PD. This is due to the fact that each of the elements produces a radiation pattern on the substrate W that has a point spread function that overlaps with radiation patterns produced by a number of other elements. For example, the Airy disk (i.e., Bessel function) radiation image produced at substrate level by a single element can have an intensity full width half maximum (FWHM) of about 80 nm for a numerical aperture (NA) of 1.2 and a wavelength (λ) of about 193 nm. A typical separation of center-points of element images at substrate level is about 20 nm. In such an arrangement, roughly $(80/20)^2=16$ elements of the array of individually controllable elements PD contribute significantly to the radiation dose at any particular point on the substrate W, and an even larger number will contribute less significantly individually.

The step of digitizing the rastorized stream of setpoint data is effective to reduce the volume of data and facilitate communication and storage of the data. However, digitization inevitably introduces a degree of rounding error. For requested dose patterns that vary rapidly (and in all directions) on length scales commensurate with the separation of center-points of radiation patterns from different elements, there can be a relatively large variation in the setpoints applied to neighboring elements of the patterning device PD. In this situation, the rounding errors associated with the digitization of different setpoints can tend to cancel each other out to some extent. In contrast, where the pattern is relatively uniform, at least in one direction, then a significant number of elements can have the same or similar setpoint value. Where this is the case, rounding errors will not cancel and the cumulative effect of the rounding errors can lead to a reduction in image quality, in particular deterioration in dose uniformity and/or critical dimension uniformity.

For example, where it is desired to produce a region of uniform dose and the setpoint desired to achieve this dose happens to be rounded up on digitization by the quantization device 512, then the entire region is likely to receive a slightly higher dose than desired because all of the elements will have the same positive rounding error. Similarly, where a desired dose pattern comprises an edge along which a constant radiation dose interfaces with a region of lower radiation dose, the rounding up or rounding down of neighboring radiation doses from different elements can lead to a shift in the position of the edge. This can occur because the position at which the radiation dose passes through a processing threshold can shift as the dose distribution near the boundary/interface is shifted up or down. Such errors can be reduced by reducing the size of the steps between different quantization levels used by the quantization device 512. However, this means that more bits will be required to represent the setpoint data stream and the datapath bandwidth will have to be increased, thus increasing costs.

According to one embodiment of the present invention, a noise controller 508 is provided that incorporates a predetermined amount of noise into the stream of setpoint data before the setpoint data is input to the quantization device 512. The addition of noise in this way acts at least partially to randomize the rounding error for radiation from different elements of the array of individually controllable elements PD. The rounding errors from different elements combine incoherently when contributing to the radiation dose at a particular point on the substrate W, which leads to a significant reduction in the dose error achieved, particularly for regions of the dose pattern with significant spatially uniform components. For example, in the arrangement discussed above where roughly 16 elements contribute to the final dose achieved at a given point on the substrate W, the rounding error for a uniform dose pattern may be reduced by about $\sqrt{16}=4$ (Central Limit Theorem of statistics). Dose and critical dimension uniformity can therefore be improved without having to increase the resolution of the quantization device 512 and datapath bandwidth.

The noise added to the data stream can comprise at least one of the following types: white noise or pseudo/quasi white noise. Various other types of "noise" can also be incorporated, but an important feature is that the noise is spatially (rather than temporally) noisy (in comparison with neighboring pixels/mirrors). Mathematically, this property can be expressed as a small or zero inner product between the noise and the pattern to be imaged on the substrate W (and/or the quantization noise/error associated with the pattern to be produced on the substrate). The noise can also therefore be generated as a predetermined unique pattern, which has the above property of being spatially noisy (at least with respect to pixels/mirrors that are within a "coherence length" of each other, i.e., close enough that the setpoint of both is relevant to the radiation dose achieved in particular regions on the substrate W). The temporal part of the noise is arbitrary, either completely repeating, or completely noisy.

Thus, the noise needs to be spatially noisy (as opposed to temporally noisy). This is another way of saying that the noise must have a degree of spatial randomness and arises because the aim of the noise is to randomize the rounding errors between images from neighboring elements (which have a spatial relationship with each other on the substrate) in a given exposure or scan. Mathematically, it is convenient to speak in terms of "inner products," which define how much correlation or overlap (in the mathematical sense) there is between two quantities. A small overlap means low correlation. According to one example of the present invention, noise is added to lower the correlation between rounding errors from different elements. Therefore, the added noise must have a low correlation (or inner product) with the pattern to be imaged (which determines the rounding errors).

The noise can be incorporated into the data stream by various mathematical operations, including addition and subtraction. Later in the datapath, means can be provided for compensating for the incorporation of noise (e.g. by removing the noise).

For example, where the incorporation of noise leads to a change in the average value of the setpoint before digitization, a noise removal device 514 can be provided in the online datapath section 530 to remove the noise or a substantial part of it after digital to analog conversion by the D/A converter 516.

In one example, a magnitude of the noise incorporated into the data stream prior to digitization can be controlled by reference to the size of the quantization steps used by the quantization device 512. The noise level should be sufficient to randomize significantly the rounding errors between radiation patterns from different elements, such that the rounding error is significantly independent of the intended radiation dose to be produced by a given element at a given time. The noise magnitude should be at least a significant fraction of the gap between quantization levels used by the quantization device 512. On the other hand, the noise magnitude should not normally be so high that it could cause the setpoint signal to jump beyond the quantization levels immediately above and below the desired analog dose.

For example, the noise could be chosen to be uniform with a peak amplitude equal to 1 LSB (Least Significant Bit) of the output from the digital-to-analog converter 516. Additionally, or alternatively, a larger amplitude, and other distributions could be applied, but in general would be less likely. In the case where the noise is added or subtracted, a noise level larger than 1 LSB may not be a problem.

In one example, noise controller 508 can incorporate noise of a predetermined magnitude by selectively amplifying noise already present in the stream of setpoint data to be input to the quantization device 512 (i.e., amplifying the noise, but not the signal). Additionally or alternatively, another noise generator (not shown) can be provided that generates noise independently and feeds it to the quantization device 512. The magnitude of the noise in this latter case can be controlled by the noise generator, by the noise controller 508, or by both devices.

In the above examples, the noise controller 508 is configured to add noise to the signal to be digitized by the quantization device 512. The use of naturally occurring noise rather than another form of randomizing signal or noise can be easily produced (for example, the noise may occur naturally due to thermal or electrical effects). The "random" nature of the noise is particularly effective for the purpose of removing statistical interaction between rounding errors from neighboring elements.

Additionally, or alternatively, other signals can be used to modify the data stream prior to quantization to achieve the same effect. Such artificially produced signals should be designed so as to have the effect of at least partially randomizing the rounding error so as to make the total error (rounding plus added noise) from neighboring elements at least more independent from each other than they would be without the incorporation of the randomizing signal. As discussed above, such a signal could be a quasi-random noise or a unique predetermined pattern that has a small inner product with likely quantization errors (i.e., no overlap or interrelationship between the added "noise" and the quantization error). A possible reason for using an artificially produced signal rather than random noise is that the artificially produced signal form can be defined more exactly (for example, in terms of a mathematical modulating function) and it can therefore be easier to remove the noise, or a fraction of the noise, if required, at a later stage in the datapath (for example, using a relatively specific filter).

Thus, according to the examples discussed above, two possible modes of operation are: 1) add noise before the quantization device 512 and subtract the same noise after the D/A converter 516; and 2) only add noise before the quantization device 512. The noise is here a locally spatially noisy signal (noisy with respect to neighboring pixels/mirrors). It can be repeated over larger spatial distances (for example, over a coherence length or longer) and may or may not be repeated in time (for example, from one exposure operation or SLM stamp to another exposure operation or SLM stamp).

In the above specific examples, the datapath architecture is described by reference to two datapath sections 520 and 530, which correspond respectively to offline and online sections of the datapath. However, the invention is not limited to this arrangement. In particular, the first and second sections 520 and 530 can both be part of an offline or online component of the datapath. Furthermore, the arrangement is shown configured to deal with rasterized data and the datapath accordingly comprises a rasterizer 506. However, embodiments of the invention can operate on other forms of data.

Although specific reference can be made in this text to the use of lithographic apparatus in the manufacture of a specific device (e.g. an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate W. The topography of the patterning device can be pressed into a layer of resist supplied to the substrate W whereupon the resist is cured by applying electromagnetic radiation, heat, pressure or a combination thereof. The patterning device is moved out of the resist leaving a pattern in it after the resist is cured.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g. semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithography apparatus, comprising:
an array of individually controllable elements that are configured to modulate a beam of radiation;
a first datapath section that is configured to convert data defining a requested dose pattern into a stream of setpoint data defining a sequence of setpoints for the array of individually controllable elements and that comprises a noise controller that is configured to incorporate noise of a predetermined magnitude into the stream of setpoint data;
a second datapath section configured to store and reproduce the stream of setpoint data for the array of individually controllable elements; and
a quantization device configured to digitize the stream of setpoint data before it is transmitted from the first datapath section to the second datapath section.

2. The lithographic apparatus of claim 1, wherein:
the noise incorporated by the noise controller for a setpoint in the sequence of setpoints corresponding to a first element of the array of individually controllable elements is substantially independent from the noise incorporated for setpoints in the sequence of setpoints that correspond to elements surrounding the first element of the array of individually controllable elements.

3. The lithographic apparatus of claim 2, wherein:
the surrounding elements comprise at least those elements whose radiation patterns overlap significantly with a radiation pattern from the first element.

4. The lithographic apparatus of claim 1, wherein:
the noise comprises at least one of white noise, pseudo-white noise, and artificially generated noise that is spatially noisy at least with respect to setpoints for neighboring elements of the array of individually controllable elements, such that the noise incorporated for a first element in the array of controllable elements is substantially uncorrelated with noise applied for elements in the array of individually controllable elements that neighbor the first element.

5. The lithographic apparatus of claim 1, wherein:
the predetermined magnitude is about one least significant bit of the setpoint data.

6. The lithographic apparatus of claim 1, wherein:
the first datapath section is configured to operate substantially offline.

7. The lithographic apparatus of claim 1, wherein:
the second datapath section is configured to operate substantially online.

8. The lithographic apparatus of claim 1, wherein:
the noise controller is configured to amplify noise already present in the stream of setpoint data to the predetermined magnitude.

9. The lithographic apparatus of claim 1, wherein the second datapath section comprises:
a digital-to-analog converter configured to convert the digitized stream of setpoint data to an analog stream of setpoint data; and
a noise removal device configured to at least partly remove from the analog stream of setpoint data noise that was added by the noise controller.

10. A device manufacturing method, comprising:
converting data defining a requested dose pattern to a stream of setpoint data defining a desired sequence of setpoints of an array of individually controllable elements;
incorporating noise into the stream of setpoint data;
digitizing the stream of setpoint data;
storing the stream of setpoint data;
reproducing the stream of setpoint data, such that the array of individually controllable elements modulates a beam of radiation based on the stream of setpoint data; and
projecting the modulated beam onto a substrate.

* * * * *